US005600152A

United States Patent [19]
Kozuka et al.

[11] Patent Number: 5,600,152
[45] Date of Patent: Feb. 4, 1997

[54] PHOTOELECTRIC CONVERSION DEVICE AND ITS MANUFACTURING METHOD

[75] Inventors: Hiraku Kozuka, Hiratsuka; Shigetoshi Sugawa, Atsugi, both of Japan

[73] Assignee: Canon Kabushiki Kaisha, Tokyo, Japan

[21] Appl. No.: 466,744

[22] Filed: Jun. 6, 1995

[30] Foreign Application Priority Data

Jun. 7, 1994 [JP] Japan ................................. 6-125027

[51] Int. Cl.$^6$ ................................................ H01L 31/0376
[52] U.S. Cl. .................... 257/55; 257/185; 204/192.25
[58] Field of Search ......................... 204/192.15, 192.25; 257/55, 53, 185, 186

[56] References Cited

U.S. PATENT DOCUMENTS

| | | | |
|---|---|---|---|
| 4,843,451 | 6/1989 | Watanabe et al. | 257/55 |
| 5,282,993 | 2/1994 | Kary | 257/55 |
| 5,453,629 | 9/1995 | Gofuku et al. | 257/185 |

FOREIGN PATENT DOCUMENTS

| | | |
|---|---|---|
| 49-91116 | 8/1974 | Japan . |
| 51-10715 | 1/1976 | Japan . |
| 3-278462 | 12/1991 | Japan . |

*Primary Examiner*—William D. Larkins
*Attorney, Agent, or Firm*—Fitzpatrick, Cella, Harper & Scinto

[57] ABSTRACT

In order to reduce the dark current due to an interfacial defect and effect higher sensitivity, there is disclosed a manufacturing method for a photoelectric conversion device having a light absorbing layer and a carrier multiplying layer at least having a non-single crystalline semiconductor, the carrier multiplying layer being composed of a plurality of graded layers of which the forbidden band width continuously changes from the minimum forbidden band width Eg1 to the maximum forbidden band width Eg2, wherein there is an energy step sufficient to avalanche multiply the carriers between a region of the maximum forbidden band width Eg2 and a region of the minimum forbidden band width Eg1 adjacent thereto, when an electric field is applied, characterized in that after the deposition of any one of the region of the minimum forbidden band width Eg1 and the region of the maximum forbidden band width Eg2, the plasma treatment is performed with a gas at least containing oxygen or nitrogen, and further the other region is deposited, or an oxide or nitride region is provided between the graded layers.

10 Claims, 7 Drawing Sheets

PHOTOELECTRIC CONVERSION DEVICE AND ITS MANUFACTURING METHOD

BACKGROUND OF THE INVENTION

1. Field of the Invention

The present invention relates to a photoelectric conversion device and its manufacturing method, and more particularly to a photoelectric conversion device such as a line sensor or an area sensor for use in reading the image in the OA (Office Automation) equipment such as a facsimile, wherein a photoconductive film is laminated on a monocrystalline semiconductor circuit substrate which is formed with a signal charge storage portion, a signal read circuit, a scan circuit, and a drive circuit, and a manufacturing method which is suitable for the photoelectric conversion device.

2. Related Background Art

Photoelectric conversion elements of the PIN structure or the Schottky structure of using a non-single crystalline semiconductor are widely known, and among them, particularly amorphous semiconductors or microcrystalline semiconductors mainly composed of silicon can be used for the photoelectric conversion unit of a one-dimensional line sensor or a layer-built solid image sensor, because they can be fabricated through the low temperature process and easily in the large area.

In the field of the solid image sensor, there has been a demand for solid image sensors with higher performance and at lower price, and the conventionally used solid image sensors include, for example, a CCD or MOS solid image sensor, wherein in the main stream the peripheral circuits such as a light receiving element portion, a signal charge storage portion, a signal read circuit, a scan circuit, and a signal processing circuit are formed on the same substrate. On the other hand, for the purpose of higher sensitivity by improved opening rate, a layer-built solid image sensor has been proposed (e.g., Japanese Laid-Open Patent Application No. 49-91116 and Japanese Laid-Open Patent Application No. 51-10715) in which a photoconductive film is laminated as light receiving element on the substrate formed with the above-mentioned semiconductor circuit.

And for the purpose of further higher sensitivity, an amplifying photoelectric conversion device and a layer-built solid image sensor have been proposed in Japanese Laid-Open Patent Application No. 3-278482, which make use of collision ionization due to an energy step at the heterojunction of the non-single crystalline semiconductor. FIG. 1A is a schematic cross-sectional view showing the structure of this photoelectric conversion device, FIG. 1B is a typical energy band diagram for this photoelectric conversion device under a non-bias condition, and FIG. 1C is a typical energy band diagram for this photoelectric conversion device under reverse bias. In FIG. 1B, the minimum forbidden band width is indicated by Eg1 and the maximum forbidden band width by Eg2.

As shown in FIG. 1A, a light absorbing layer 810 independent of a multiplying layer and a plurality of graded layers 801 to 809 which become multiplying layers are sandwiched by a p-type semiconductor layer 811 which becomes a charge injection blocking layer and an n-type semiconductor layer 815, wherein the electrical connection is made between the p-type semiconductor layer 811 and an electrode 813, and between the n-type semiconductor layer 815 and an electrode 814, and these layers are formed on a glass substrate 816. The graded layers 801 to 809 have the forbidden band width gradually changing from Eg1 to Eg2, such that the minimum forbidden band width Eg1 and the maximum forbidden band width Eg2 are in contact with each other in adjacent graded layers.

In operation, by applying a voltage at which the carrier drift occurs sufficiently, as shown in FIG. 1C, electrons among carriers occurring in the light absorbing layer 810 due to light incident are drifted to a graded layer 801 where the forbidden band width continuously changes. Drifted electrons reach at a heterojunction region between the maximum forbidden band and the minimum forbidden band where there is an energy step, giving rise to carrier multiplication owing to collision ionization. That is, this photoelectric conversion device amplifies the light signal with lower noise, using collision ionization of photocarriers due to energy step at the heterojunction, and has a super high sensitivity as compared with the photoelectric conversion devices as heretofore known.

A photoelectric conversion device as proposed in the Japanese Laid-Open Patent Application No. 3-278482 as above cited makes use of energy step occurring at the heterojunction of amorphous SiC and amorphous SiGe for the photocarrier multiplication. If an electric field to cause photocarriers to run is applied to such heterojunction, the dark current caused by the defect on the hetero interface may increase in some cases, for which the improvement is desired.

Though the manufacturing method of this hetero interfacial region has not been specifically disclosed, the typical interface forming methods by plasma CVD may include a method in which after deposition of amorphous SiGe, the plasma is stopped temporarily to replace the source gas, and then the plasma is excited again to start the deposition of amorphous SiC, and a method in which the source gas is only changed instantaneously under the condition where the plasma is continuously excited.

However, since the examination by the present inventors indicates that there is no significant difference in the dark current between such methods, it is considered that the mixture of C and Ge especially at the hetero interface is a main factor of producing the dark current.

FIG. 2 shows the results of evaluation with SIMS (Secondary Ion Mass Spectrometry) for the mutual diffusion of Ge and C at the interface between amorphous SiGe and amorphous SiC fabricated by a method in which after the deposition of amorphous SiGe, the plasma is stopped temporarily to replace the source gas, and then the plasma is excited again to start the deposition of amorphous Si. From this results, the interface steepness from an interface width from 84% to 16% can be obtained to be about 40 angstroms. However, since the knock-on of primary ions spreads as far as about 20 angstroms with this spectrometry method, it is believed that the practical mutual diffusion region is about 20 angstroms, and this region will possibly produce the defect due to the mixture of C and Ge. Accordingly, to reduce further dark current, it is necessary that this region of mutual diffusion is made as small as possible.

SUMMARY OF THE INVENTION

The present invention has been achieved based on the above respects, and its object is to provide an amplifying photoelectric conversion device having a non-single crystalline semiconductor heterojunction in which the dark current caused by the defect at the interface of heterojunction is reduced and its manufacturing method.

Also, the present invention aims to provide a manufacturing method for a photoelectric conversion device having a light absorbing layer and a carrier multiplying layer at least having a non-single crystalline semiconductor, said carrier multiplying layer being composed of a plurality of graded layers of which the forbidden band width continuously changes from the minimum forbidden band width Eg1 to the maximum forbidden band width Eg2, wherein there is an energy step sufficient to avalanche multiply the carriers between a region of the maximum forbidden band width Eg2 and a region of the minimum forbidden band width Eg1 adjacent thereto, when an electric field is applied, characterized in that after the deposition of any one of said region of the minimum forbidden band width Eg1 and said region of the maximum forbidden band width Eg2, the plasma treatment is performed with a gas at least containing oxygen or nitrogen, and further the other region is deposited.

Also, the present invention aims to provide a photoelectric conversion device having a light absorbing layer and a carrier multiplying layer having a non-single crystalline semiconductor, said carrier multiplying layer being composed of a plurality of graded layers of which the forbidden band width continuously changes from the minimum forbidden band width Eg1 to the maximum forbidden band width Eg2, wherein there is an energy step sufficient to avalanche multiply the carriers between a region of the maximum forbidden band width Eg2 and a region of the minimum forbidden band width Eg1 adjacent thereto, when an electric field is applied, characterized in that an oxide or nitride region is formed between said graded layers.

DETAILED DESCRIPTION OF THE PREFERRED EMBODIMENTS

A manufacturing method of a photoelectric conversion device of the present invention and its actions will be described below using FIGS. 3 and 4.

Figure 1A:
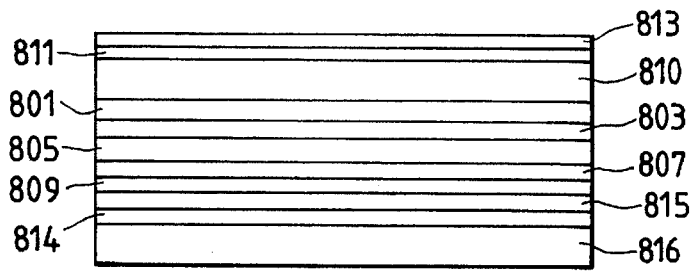
FIG. 1A is a schematic cross-sectional structure view showing an example of the structure of a photoelectric conversion device.
Figure 1B:
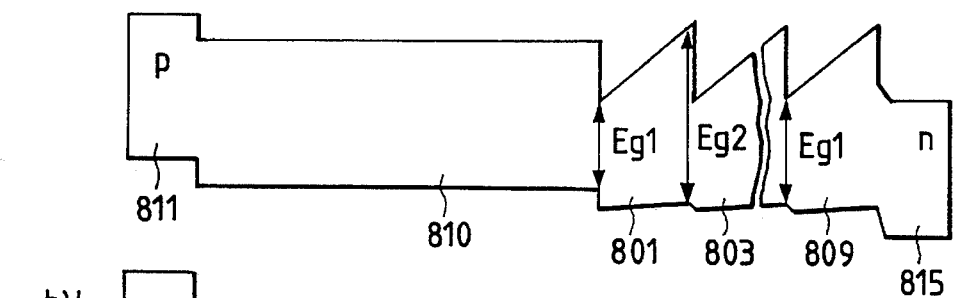
FIG. 1B is a typical energy band diagram of the photoelectric conversion device as shown in FIG. 1A under a non-bias condition.
Figure 1C:
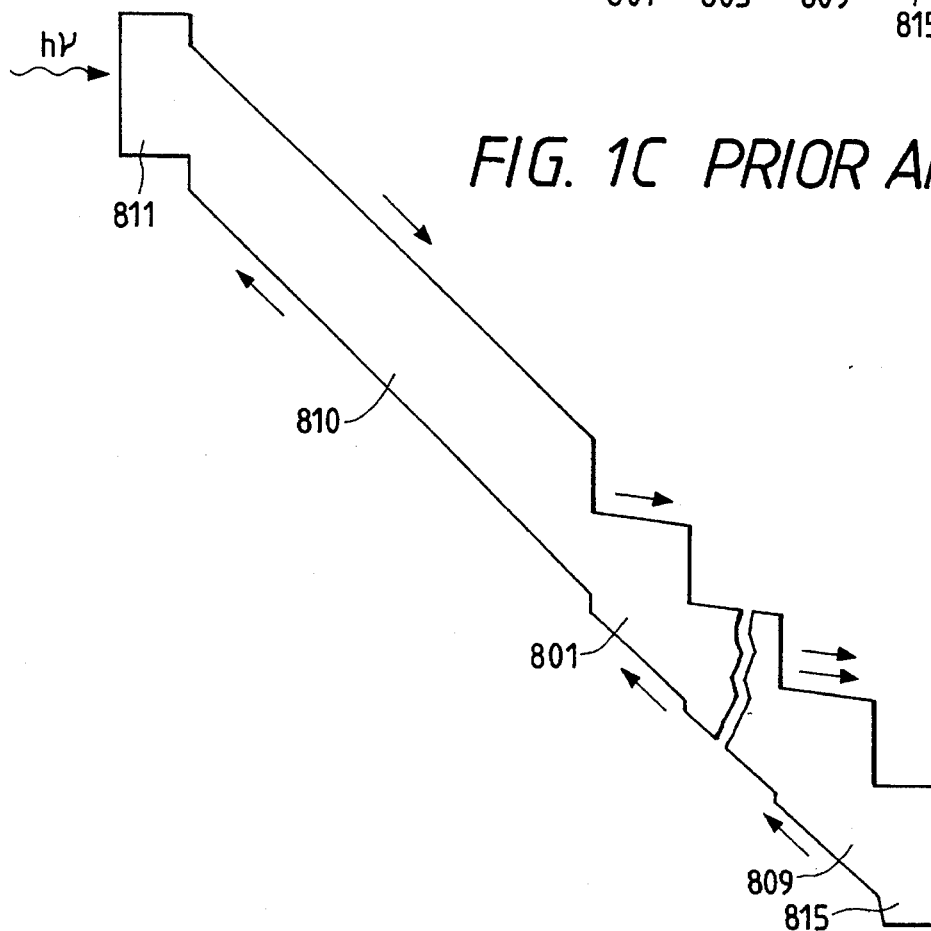
FIG. 1C is a typical energy diagram of the photoelectric conversion device as shown in FIG. 1A under reverse bias.
Figure 2:
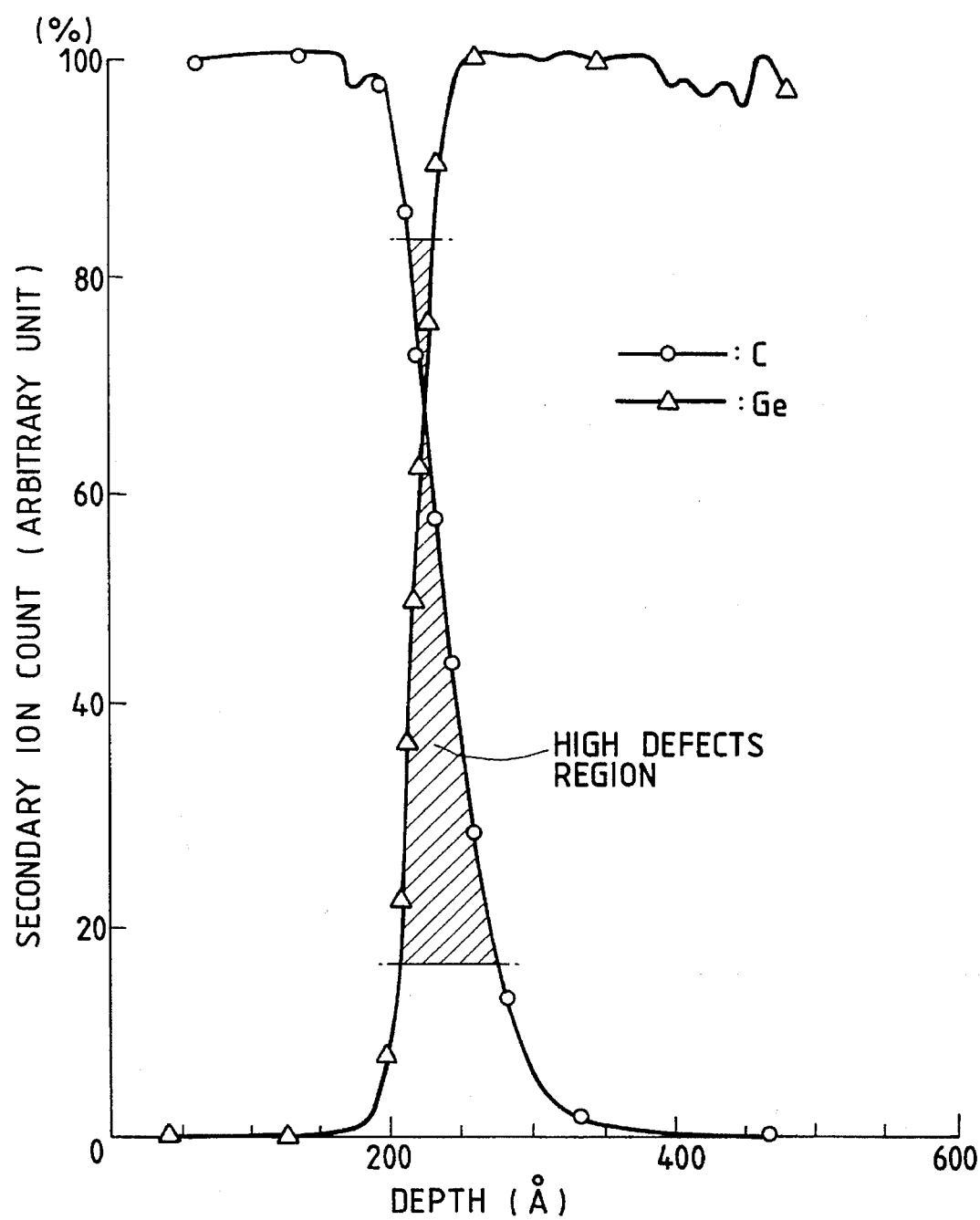
FIG. 2 is a graphic representation showing the mutual diffusion of C and Ge on the hetero interface of amorphous SiGe and amorphous SiC by SIWS spectrometry.
Figure 3:
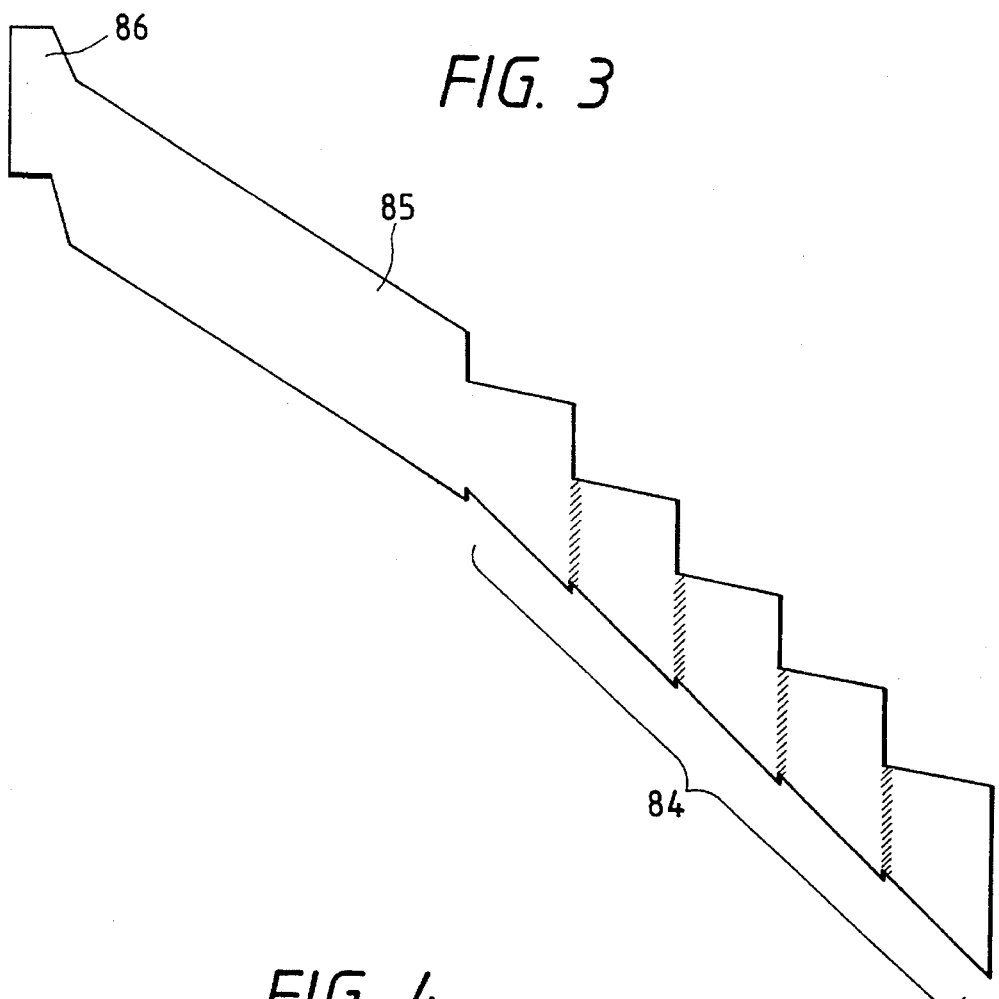
FIG. 3 is a typical energy band diagram of one photoelectric conversion device, under reverse bias, suitably manufactured by a manufacturing method of the present invention.

FIG. 3 is a typical energy band diagram of a photoelectric conversion device of the present invention under reverse bias. This photoelectric conversion device operates as follows. Upon incidence of a light from the side of a charge injection blocking layer 86, the light absorbed by a light absorbing layer 85 is photoelectrically converted, electrons among electron and hole pairs formed will cause ionization due to energy step at the heterojunction of each graded layer, producing new electron and hole pairs to effect multiplication action.

Naturally, since each of the graded layers takes action similarly, the multiplication results in $2^n$ for the number of layers of n.

The light absorbing layer 85 and the multiplying layer 84 constituting the photoelectric conversion device are preferably made of non-single crystalline semiconductor materials because they can be formed at low temperatures and are beneficial for the lamination on the semiconductor circuit substrate. Specific examples include amorphous Si, amorphous SiGe (containing Si atoms and Ge atoms) and amorphous SiC (containing Si atoms and C atoms) which are compensated by hydrogen and/or halogen elements. In this way, because the constituent material of elements is non-single crystalline semiconductor material, they can be fabricated at low temperatures (e.g., from 200° to 300° C.) by e.g. plasma CVD, and because the forbidden band width can be easily controlled by composition modulation, the multiplying layer with step back structure can be not only relatively easily made, but also a considerably reliable step back structure can be realized with the diffusion of atoms due to heating suppressed, which is beneficial for the lamination of multi layers. While there has been described a case where the multiplying layer has the forbidden band width continuously changing, the forbidden band width may be changed stepwise. Also, the light absorbing layer forbidden band width may be fixed or continuously changed.

Figure 4:
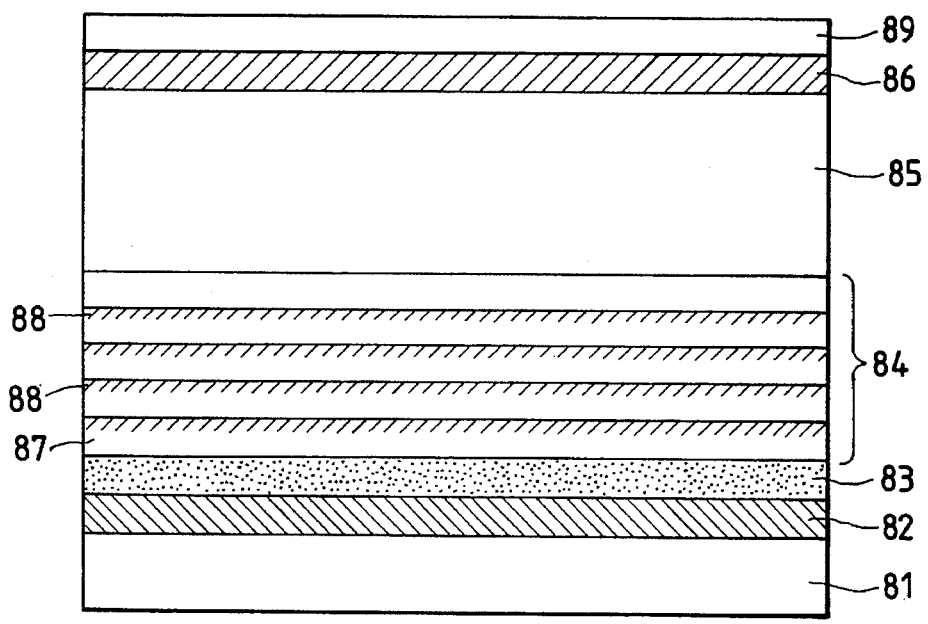
FIG. 4 is a schematic cross-sectional view of one photoelectric conversion device suitably manufactured by a manufacturing method of the invention.

Herein, FIG. 4 schematically shows a portion 88 plasma treated at the hetero interface. This plasma treatment will be described below.

FIG. 4 is a schematic view in cross section of the structure of a photoelectric conversion device of the invention. As shown in the same figure, an electrode 82, a charge injection blocking layer 83, an multiplying layer 84, a light absorbing layer 85, a charge injection blocking layer 86, and a transparent electrode 89 are formed on a glass substrate 81. Herein, the multiplying layer 84 is composed of a lamination of five graded layers 87 having the forbidden band width continuously changing, and having a plasma treated portion on each graded layer interface. Accordingly, the fabrication procedure is as follows.

First, the electrode 82 and the charge injection blocking layer 83 are formed on the glass substrate 81, and then a first graded layer 87 is deposited. Thereafter, the discharge is stopped to exhaust the source gas and introduce a gas at least containing oxygen and nitrogen, then resumed to oxidize or nitrify the minimum forbidden band width region of the graded layer, and stopped again to exhaust the gas. And again a source gas for forming a maximum forbidden band width region of the graded layer 87 is introduced to deposit the next graded layer 87. By repeating this processing, a photoelectric conversion device as shown in FIG. 4 can be formed.

Then, the depth of oxidized or nitrified region of the minimum forbidden band width for the graded layer may be 20 angstroms or greater as considered from the result of FIG. 3. While herein the maximum forbidden band width region is formed after the minimum forbidden band width region surface is plasma treated with a gas at least containing oxygen and nitrogen, it is needless to say that when each layer of the photoelectric conversion device as shown in FIG. 4 is laminated in reverse order, the minimum forbidden band width region may be formed after the maximum forbidden band width region surface is plasma treated with a gas at least containing oxygen and nitrogen. The plasma treatment time may be appropriately determined, but preferably from one to thirty minutes, and more preferably from one to ten minutes.

Herein, the examples of gases suitable for the plasma treatment may include, for example, $O_2$, $N_2$, $NH_3$, $H_2O$, $NO_2$, $N_2O$, and $NO$. Also, a dilution gas such as $H_2$, $He$ or $Ar$ may be added to these gases. By plasma treating the minimum forbidden band width region for the graded layer, e.g., the surface of amorphous SiGe, the surface neighborhood of amorphous SiGe is covered with oxygen or nitrogen atoms, and by depositing thereon the maximum forbidden band width region for the graded layer, e.g., amorphous SiC, carbon atoms immediately after deposition are bonded with oxygen or nitrogen atoms. That is, it is believed that by plasma treating the hetero interface, the minimum forbidden band width region for the graded layer and the maximum forbidden band width for the graded layer will form a hetero bond bias oxygen or nitrogen atoms, preventing the mixing of C and Ge which may cause the occurrence of dark current. Further, since oxygen and nitrogen has a smaller coordination number than four coordination elements such as silicon, germanium and carbon, SiGe region and SiC region near the heterojunction have relaxed structure owing to lower average coordination number, possibly resulting in the effect that the defect near the hetero interface is reduced as compared with when directly forming the hetero bonding. In any case, according to a manufacturing method of the present invention, the dark current can be reduced below the conventional level. Furthermore, the density of gas introduced into the plasma treatment is not specifically limited as far as the plasma can be generated, but may be desirably a density or a pressure enough to allow for the control of the treatment.

The present invention will be more specifically described in greater detail by way of example with reference to the drawings.

EXAMPLE 1

Figure 5A:
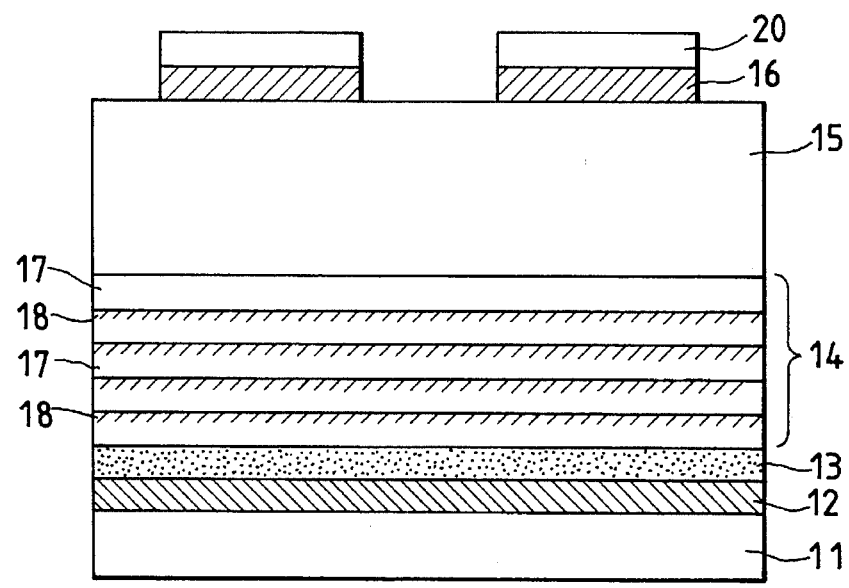
FIG. 5A is a schematic view in cross section of the structure of a photoelectric conversion device in an example 1 of the manufacturing method for the photoelectric conversion device of the invention.
Figure 5B:
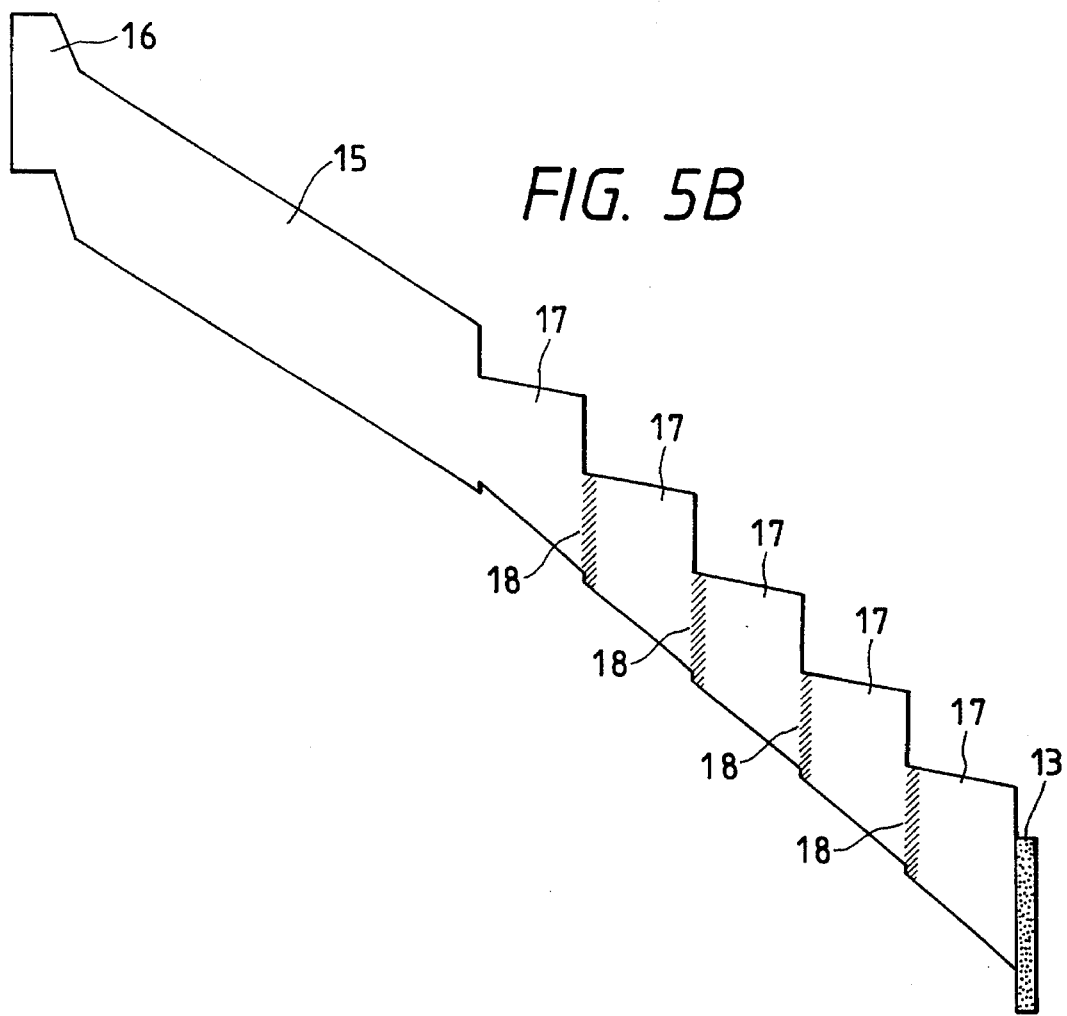
FIG. 5B is a typical energy band diagram of the photoelectric conversion device under reverse bias.

One preferred example of a manufacturing method of a photoelectric conversion device of the present invention is presented below in connection with FIGS. 5A and 5B. FIG. 5A is a typical cross-sectional view of a photoelectric conversion device fabricated by a manufacturing method of the present invention, and FIG. 5B is a typical energy band diagram under reverse bias.

A Cr electrode 12 is formed 1000 angstroms thick as the electrode on a glass substrate 11 by sputtering, then an $n^+$ amorphous Si 13 which is a charge injection blocking layer is deposited 1000 angstroms, using a capacitive coupled plasma CVD system, and an multiplying layer 14 is formed 1500 angstroms thick. Herein, this multiplying layer 14 has a structure of the lamination of graded layers 17 in five stages, with an oxygen plasma treatment 18 applied on each interface. A graded layer 17 can be realized by continuously changing the composition ratio of carbon to silicon, or germanium to silicon, to have continuous forbidden band width from amorphous SiC to amorphous SiGe.

This multiplying layer 14 can be fabricated by the following method. The gases $SiH_4$, $GeH_4$, $CH_4$, $H_2$ and $O_2$ to be introduced into a film formation chamber are used and supplied into the film formation chamber under the control of flow rate by mass flow controllers which are independent from each other (hereinafter referred to as "MFC"). Further, the MFCs are controlled by a computer, so that the gas flow can be adjusted to obtain a desired profile of forbidden band width. First, $SiH_4$, $CH_4$ and $H_2$ are used as the first source gas, and deposited, and at the same time with the start of deposition, the flow of $CH_4$ is decreased at a constant rate. If the flow rate of $CHG_4$ becomes zero, $GeH_4$ is increased at a constant rate. And if the graded layer 17 reaches a desired film thickness, the discharge is stopped. That is, the flow of $GeH_4$ and $CH_4$ is controlled so that the profile of a desired forbidden band width may be obtained for a desired film thickness of composition changing layer. Subsequently, the source gas is exhausted and $H_2$ and $O_2$ are introduced to effect discharging.

The conditions for this plasma treatment are listed below:

$H_2$: 20 SCCM $O_2$: 10 SCCM

Pressure: 0.2 Torr

Rf electric power: 2 W

Plasma treatment time: one minute

If the plasma treatment is completed, $H_2$ and $O_2$ are exhausted and source gases $SiH_4$, $CH_4$ and $H_2$ are introduced again, to deposit a next graded layer.

By repeating the above procedure, the multiplying layer 14 is formed.

Subsequently, an amorphous Si layer 15 which is a light absorbing layer is formed 6000 angstroms thick and a $p^+$ amorphous Si layer 16 which is a charge injection blocking layer is formed 500 angstroms thick.

As above described, after the multiplying layer, the light absorbing layer and the charge injection blocking layer are fabricated consecutively by plasma CVD, an ITO 20 as a transparent electrode is formed by sputtering, and finally pixel separation is effected by photolithography, thereby obtaining a constitution of the present invention.

Furthermore, it was supposed in this example that the thickness of each of the graded layers 17 was about 300 angstroms, the minimum forbidden band width Eg1 was 1.4 eV and the maximum forbidden band width Eg2 was 2.9 eV.

A comparison between the photoelectric conversion device by the manufacturing method of the present invention and the photoelectric conversion device without plasma treatment on the hetero interface indicates that the dark current under a bias where the multiplication rate of photocurrent is 20 times for the photoelectric conversion device of the invention is about one-half of that of the photoelectric conversion device without plasma treatment, whereby the effectiveness of the low dark current of the invention was ascertained. Also, the light response characteristics were substantially the same for both.

While the gases for the plasma treatment used were $H_2$ and $O_2$ in this example, it should be noted that the present invention is not limited to such gases.

EXAMPLE 2

Figure 6:
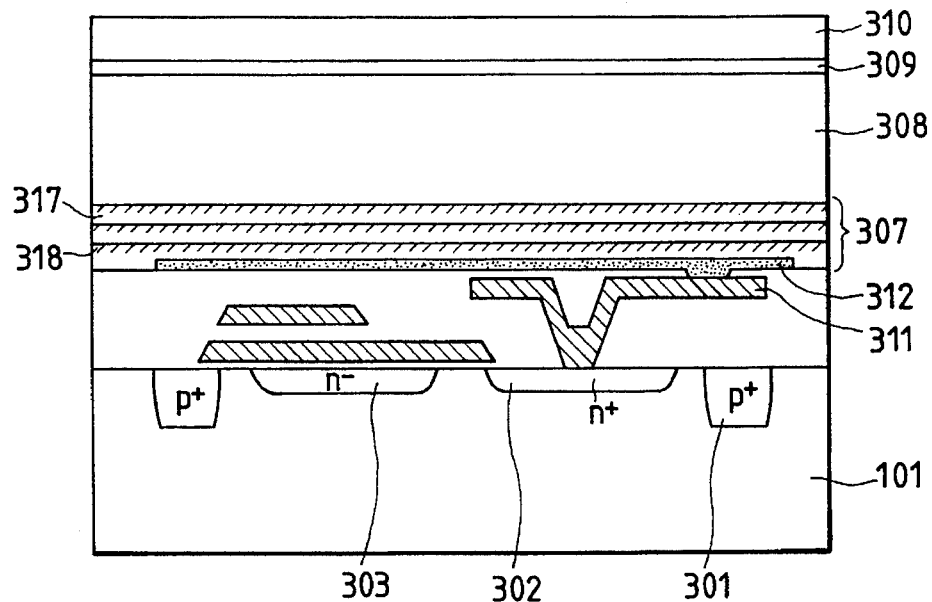
FIG. 6 is a schematic view in cross section of the structure of a layer-built solid image sensor in an example 2 of the manufacturing method for the photoelectric conversion device of the invention.

Another preferred example of the present invention will be described below using FIG. 6.

In this example, a layer-built solid image sensor is presented in which a photoelectric conversion device fabricated by a manufacturing method of the invention is laminated on CCD as the photoconductive film.

First, a $p^+$ region 301 which becomes a channel stopper and an n regions which become a storage diode 302 and a vertical CCD 303 are formed on a p-type single crystalline silicon substrate 101. Subsequently, a gate oxide film and a polysilicon electrode are formed, using a normal CCD creation process. Then, an oxide film which becomes an interlayer insulator is formed, a contact hole is opened on the storage diode, a first pixel electrode 311 is formed, further an interlayer insulator is deposited, the flattening is made by an etch back method, and a second pixel electrode 312 is formed. The etch back method as referred to herein is one for flattening the silicon oxide film by performing etching under such conditions that the etching rates of the resist and the silicon oxide film become equal using RIE (Reactive Ion Etching). Then, a multiplying layer 307, a light absorbing layer 308 and a charge injection blocking layer 309 are formed using a capacitive coupling plasma CVD system. Herein, the multiplying layer 307 is one in which three graded layers 317 having continuously changing composition ratio of carbon to silicon or germanium to silicon are laminated to have continuous forbidden band width from amorphous SiC to amorphous SiGe, with each hetero interface being plasma treated by $N_2$.

The conditions of this plasma treatment are listed below:

$N_2$: 50 SCCM

Pressure: 0.25 Torr

Rf electric power: 10 W

Plasma treatment time: 30 minutes

Subsequently, $SiH_4$ and $H_2$ are selected from the source gases to make an amorphous silicon 308, 1 µm thick which is a light absorbing layer and then a p-type microcrystal Si 309, 500 angstroms thick which is a charge injection blocking layer by adding $B_2H_6$ to the source gas. After the multiplying layer, the light absorbing layer and the charge injection blocking layer are fabricated consecutively, as above described, an ITO 310 as a transparent electrode is formed by sputtering, thereby obtaining a constitution of the present invention.

The thickness of each of the graded layers constituting the multiplying layer 307 was about 200 angstroms, the minimum forbidden band width Eg1 was 1.4 eV and the maximum forbidden band width Eg2 was 3.0 eV in this example.

The layer-built solid image sensor fabricated in this way had high sensitivity and low noise.

EXAMPLE 3

Figure 7:
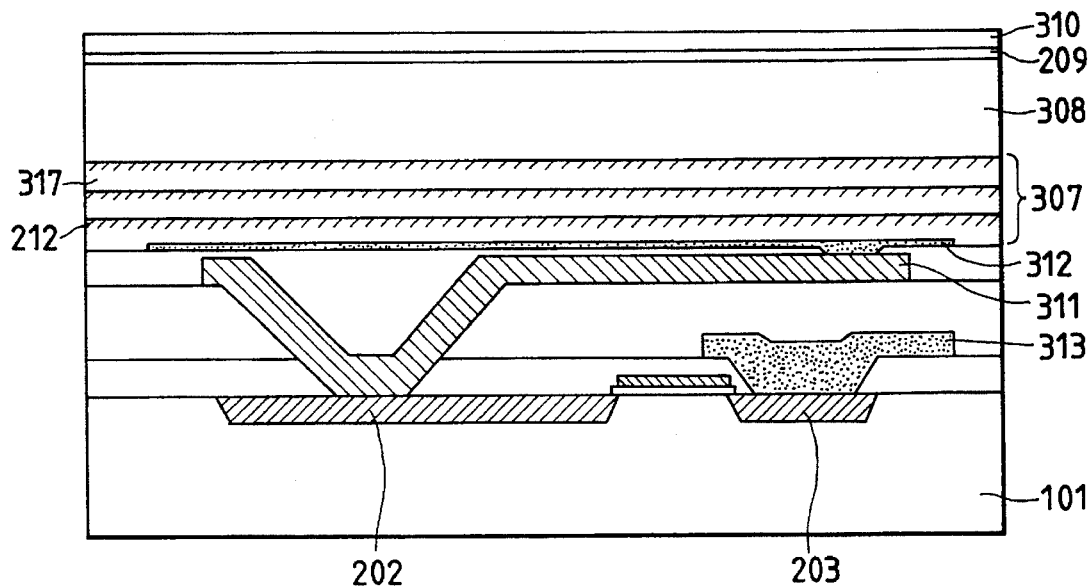
FIG. 7 is a schematic view in cross section of the structure of a layer-built solid image sensor in an example 3 of the manufacturing method for the photoelectric conversion device of the invention.

Another preferred example of the invention will be described below using FIG. 7.

In this example, a layer-built solid image sensor is shown in which a photoconductive film made by a manufacturing method of the invention is laminated on a semiconductor circuit substrate formed with MOS transistors.

This example is substantially the same as the example 2, except that a signal read circuit is a MOS transistor, and the plasma treating gas is $NO_2$. On a p-type single crystalline silicon substrate 101 are formed a $p^+$ region (not shown) which becomes a channel stopper, an n region 202 which becomes a source and an n region 203 which becomes a drain. Note that the n region 202 is also used as the storage capacitor. Subsequently, polysilicon which becomes a gate oxide film and a gate electrode is formed, and after the deposition of an interlayer insulator a contact hole is opened in a drain region 203 to form a read electrode 313, further an interlayer insulator is deposited, a contact hole is opened in a source region to form a first pixel electrode 311, then an interlayer insulator is deposited, and a second pixel electrode 312 connecting to the first pixel electrode 311 is formed, followed by the flattening. Thereafter, an multiplying layer 307, a light absorbing layer 308 and a charge injection blocking layer 209 are formed. Herein, the multiplying layer 307 has a structure where three graded layers 317 with continuously changing composition ratio of carbon to silicon of germanium to silicon are laminated so as to have the continuously changing forbidden band width from amorphous SiC to amorphous SiGe, with each hetero interface subjected to plasma treatment 212 of $NO_2$ gas. Also, the light absorbing layer 308 is an amorphous silicon and the charge injection blocking layer 209 is a p-type microcrystal Si. After the multiplying layer, the light absorbing layer and the charge injection blocking layer are made consecutively, an ITO as a transparent electrode 310 is finally formed by sputtering, thereby obtaining a layer-built solid image sensor by the manufacturing method of the present invention.

The conditions of this plasma treatment on the hetero interface are listed below:

$N_2$: 10 SCCM $NO_2$: 50 SCCM

Pressure: 0.1 Torr

Rf electric power: 2 W

Plasma treatment time: one minute

The layer-built solid image sensor fabricated in this way had high sensitivity and low noise.

EXAMPLE 4

This example is one in which a bipolar solid image sensor is used as a semiconductor circuit substrate and a photoelectric conversion device fabricated by a manufacturing method of the present invention is laminated thereon.

Figure 8:
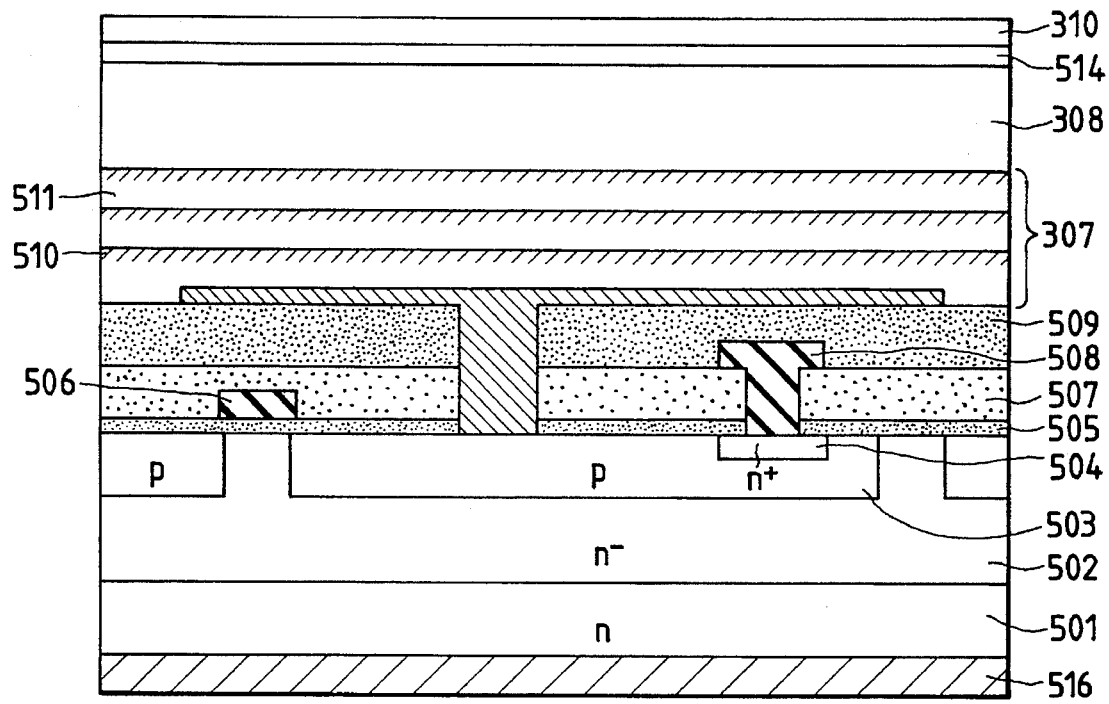
FIG. 8 is a schematic view in cross section of the structure of a layer-built solid image sensor in an example 4 of the manufacturing method for the photoelectric conversion device of the invention.
Figure 9:
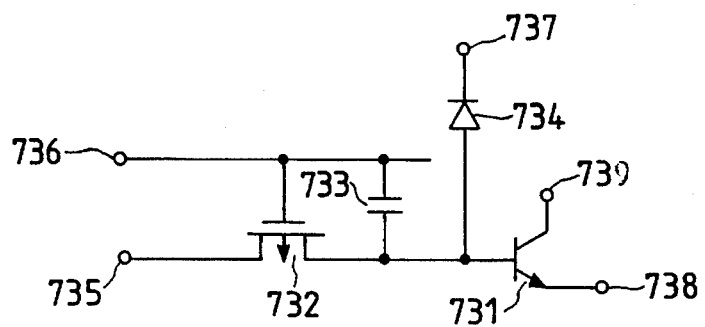
FIG. 9 is an equivalent circuit diagram of one pixel for the layer-built solid image sensor of FIG. 8.
Figure 10:
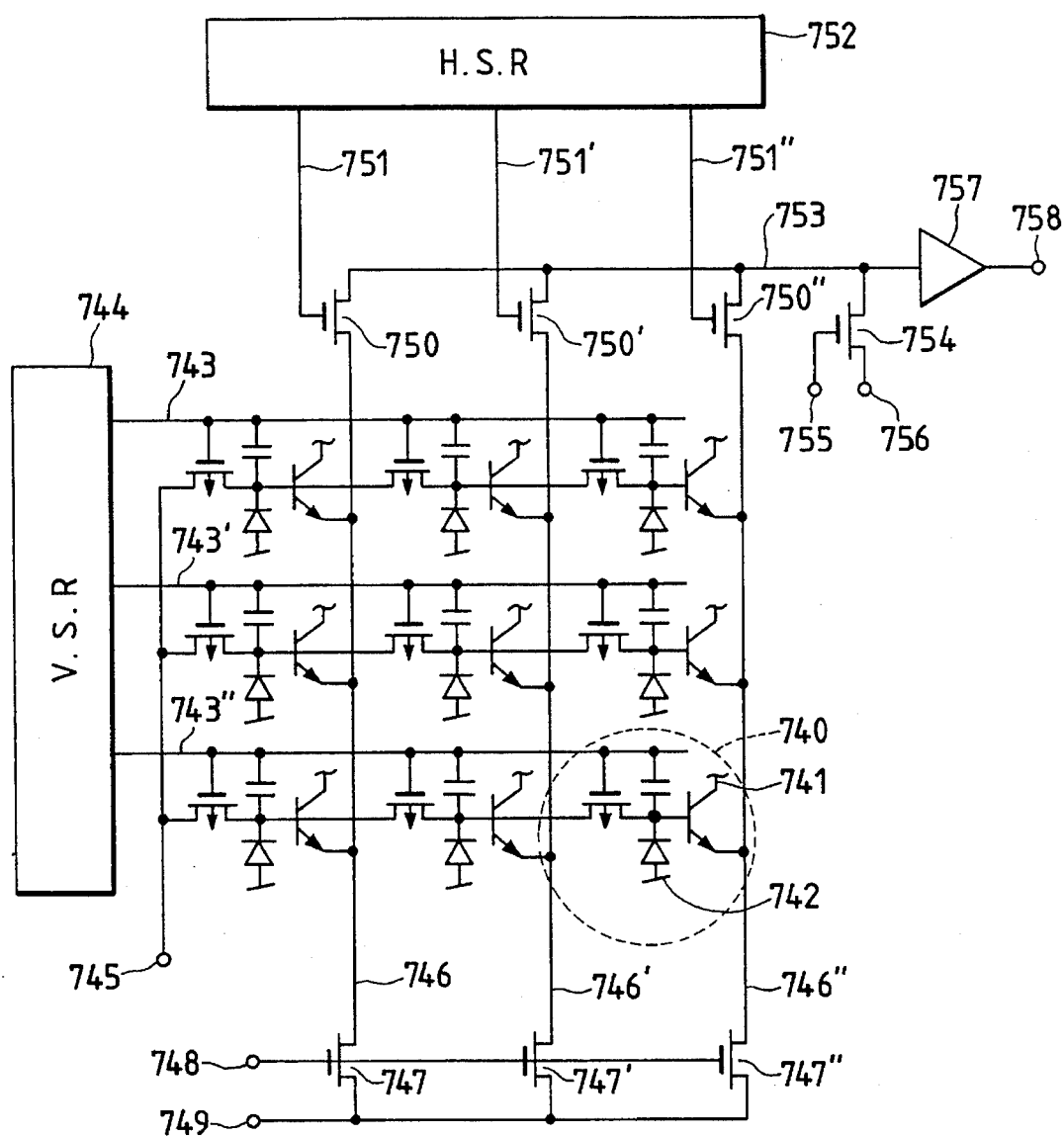
FIG. 10 is an equivalent circuit diagram of the whole of the layer-built solid image sensor of FIG. 8.

FIG. 8 is a schematic cross-sectional view near a light receiving unit of the example of the invention, FIG. 9 is an equivalent circuit diagram of one pixel, and FIG. 10 is an equivalent circuit of the whole device and a block equivalent circuit diagram.

In FIG. 8, an $n^-$ layer 502 which becomes a collector region is formed on an n-type silicon substrate 501 by epitaxial growth, and a p base region 503 and further an $n^+$ emitter region 504 are formed inside to constitute a bipolar transistor. This p base region 503 is isolated from adjacent pixels, and a gate electrode 506 is formed, with an oxide film 505 sandwiched, and between adjacent p base regions in the horizontal direction. Accordingly, a p channel MOS transistor is constituted with the adjacent p base regions 503 as source and drain regions. The gate electrode 506 also acts as a capacitor to control the potential of the p base region 503. Also, the collector electrode 516 is ohmic connected to the back surface of the substrate 501.

Herein, after an insulation layer 507 is formed, an emitter electrode 508 is formed. Thereafter, an insulation layer 509 is formed and the flattening is made. Subsequently, a pixel electrode connecting to the p base region 503 is formed by etching the insulation layers 507, 509 and the oxide film 505.

Subsequently, three graded layers 511 as the multiplying layer 307, an amorphous Si 308 as the light absorbing layer, and n-type microcrystal Si 514 as the charge injection blocking layer are formed as the film in consecutive manner by rf plasma CVD, to form an ITO of transparent electrode 310. Herein, the graded layer ranges from amorphous SiGe to amorphous SiN, having a potential profile for multiplying the positive hole, with a plasma treatment 510 by $O_2$ gas applied on each interface.

The conditions of this plasma treatment are listed below:

$O_2$: 50 SCCM

Pressure: 0.2 Torr

Rf electric power: 2 W

Plasma treatment time: 30 seconds

In this example, an equivalent circuit of one pixel comprises a p channel MOS transistor 732 and a capacitor 733, and a photoelectric conversion device 734 which are connected to the base of a bipolar transistor 731 composed of crystalline silicon, a terminal 735 for giving a potential to the base, a terminal 736 for driving the p-channel MOS transistor 732 and capacitor 733, a sensor electrode 737, an emitter electrode 738 and a collector electrode 739, as shown in FIG. 9.

FIG. 10 is a schematic circuit configuration diagram in which one pixel cell 740 as shown in FIGS. 8 and 9 are arranged in two dimensional matrix of 3×3, its pixel portion being partially shown herein. In the same figure, a collector electrode 741 of one pixel cell 740 is provided for each of all the pixels, and a sensor electrode 742 is provided for each of all the pixels. Also, the gate electrode and the capacitor electrode of the PMOS transistor are connected line by line to the driving wirings 743, 743' and 743", which are in turn connected to a vertical shift register (V.S.R) 744. The vertical wirings 746, 746' and 746" are connected to the switches 747, 747' and 747" for resetting the electric charge of the vertical wirings and the reading switches 750, 750' and 750", respectively. The gate electrodes of the reset switches 747, 747' and 747" are commonly connected to a terminal 748 for applying a vertical reset pulse, and the source electrode is connected to a terminal 749 for applying a vertical line reset voltage. The gate electrode of the read switches 750, 750' and 750" are connected via the wirings 751, 751' and 751" to a horizontal shift register (H.S.R) 752, and the drain electrode is connected via a horizontal read wiring 753 to an output amplifier 757. The horizontal read wiring 753 is connected to a switch 754 for resetting the charge of the horizontal read wiring.

The reset switch 754 is connected to a terminal 755 for applying a horizontal wiring reset pulse and a terminal 756 for applying a horizontal wiring reset voltage. And the output of the output amplifier 757 is taken out from the terminal 758.

The operation will be briefly described below using FIGS. 8 and 10.

The incident light is absorbed by the light absorbing layer 308 in FIG. 8, generated carriers are multiplied by the multiplying layer 307 and stored in the base region 503. If a drive pulse output from the vertical shift register 744 of FIG. 10 appears on the drive wiring 743, the base potential rises via the capacitor, a signal charge in accordance with the light quantity is taken out from the pixel at the first line into the vertical wirings 746, 746' and 746".

Then, if a scan pulse is sequentially output from the horizontal shift register 752 to the wirings 751, 751' and 751", the switches 750, 750' and 750" are controlled for the ON and OFF sequentially, so that a signal is taken out through the amplifier 757 to the output terminal 758. In this case, the reset switch 754 is turned on, while the switches 750, 750' and 750" are turned on in sequence, to remove the residual charge of the horizontal wiring 753.

Then, the vertical line reset switches 747, 747' and 747" are turned on to remove the residual charge of the vertical wirings 746, 746' and 746". And if a negative pulse is applied from the vertical shift register 744 to the driving wiring 743, a pMOS transistor of each pixel at the first line is turned on, to remove the base residual charge for each pixel and effect initialization.

Then, a drive pulse output from the vertical shift register 744 appears on the drive wiring 743', and a pixel signal at the second line is similarly taken out. Then, a signal charge for the pixel at the third line can be taken out in similar manner.

By repeating the above operation, this apparatus can operate.

A photoelectric conversion device thus fabricated had high sensitivity and high S/N ratio.

As above described, according to the present invention, it is possible to fabricate a photoelectric conversion device and a layer-built solid image sensor with low dark current and high sensitivity, and implement a manufacturing method thereof.

It should be understood that the present invention is not limited to the above-described examples, but variations or combinations thereof may be appropriately made within the scope or spirit of the present invention.

What is claimed is:

1. A manufacturing method for a photoelectric conversion device having a light absorbing layer and a carrier multiplying layer at least having a non-single crystalline semiconductor, said carrier multiplying layer being composed of a plurality of graded layers of which the forbidden band width continuously changes from the minimum forbidden band width Eg1 to the maximum forbidden band width Eg2, wherein there is an energy step sufficient to avalanche multiply the carriers between a region of the maximum forbidden band width Eg2 and a region of the minimum forbidden band width adjacent thereto, when an electric field is applied, characterized in that after the deposition of any one of said region of the minimum forbidden band width Eg1 and said region of the maximum forbidden band width Eg2, the plasma treatment is performed with a gas at least containing oxygen or nitrogen, and further the other region is deposited.

2. A manufacturing method for a photoelectric conversion device according to claim 1, wherein said region of the minimum forbidden band width Eg1 has an amorphous material having mainly silicon, germanium, and hydrogen, and said region of the maximum forbidden band width Eg2 has an amorphous material having mainly silicon, carbon and hydrogen.

3. A manufacturing method for a photoelectric conversion device according to claim 1, wherein said plasma treatment is performed from one to thirty minutes.

4. A manufacturing method for a photoelectric conversion device according to claim 1, wherein said gas containing oxygen or nitrogen has at least one selected from a group comprised of $O_2$, $N_2$, $NH_3$, $H_2O$, $NO_2$, and NO.

5. A manufacturing method for a photoelectric conversion device according to claim 1, wherein said gas containing oxygen or nitrogen is diluted by at least one selected from a group comprised of $H_2$, He, and Ar.

6. A manufacturing method for a photoelectric conversion device according to claim 1, wherein said region of the minimum forbidden band width Eg1 has an amorphous material having mainly silicon, germanium and hydrogen, and said region of the maximum forbidden band width Eg2 has an amorphous material having mainly silicon, nitrogen and hydrogen.

7. A photoelectric conversion device having a light absorbing layer and a carrier multiplying layer having a non-single crystalline semiconductor, said carrier multiplying layer being composed of a plurality of graded layers of which the forbidden band width continuously changes from the minimum forbidden band width Eg1 to the maximum forbidden band width Eg2, wherein there is an energy step sufficient to avalanche multiply the carriers between a region of the maximum forbidden band width Eg2 and a region of the minimum forbidden band width Eg1 adjacent thereto, when an electric field is applied, characterized in that an oxide or nitride region is formed between said graded layers.

8. A photoelectric conversion device according to claim 7, wherein said graded layer has the composition changing from an amorphous material having silicon and germanium to an amorphous material having carbon or silicon and nitrogen.

9. A photoelectric conversion device according to claim 7, wherein said oxide or nitride region has a thickness of 20 angstroms or greater.

10. A photoelectric conversion device according to claim 7, wherein said oxide or nitride region is a region formed by the reaction of the graded layer with oxygen or nitrogen.

* * * * *

UNITED STATES PATENT AND TRADEMARK OFFICE
CERTIFICATE OF CORRECTION

PATENT NO. : 5,600,152
DATED : February 4, 1997
INVENTOR(S) : HIRAKU KOZUKA ET AL.

Page 1 of 2

It is certified that error appears in the above-identified patent and that said Letters Patent is hereby corrected as shown below:

COLUMN 2

Line 7, "light incident" should read --incident light--.
Line 48, "this" should read --these--.

COLUMN 3

Line 40, "SIWS" should read --SIMS--.

COLUMN 4

Line 36, "by" should read --by,--.
Line 39, "step back" should read --step-back--.
Line 40, "step" should read --step- --.
Line 54, "an" should read --a--.
Line 59, "portion" should read --portion 88--.

COLUMN 6

Line 2, "an" should read --a--.

COLUMN 7

Line 10, "n regions" should read --n region--.
Line 18, "etch back" should read --etchback--.
Line 19, "etch back" should read --etchback--.

COLUMN 8

Line 12, "an" should read --a--.
Line 17, "of" should read --or--.

UNITED STATES PATENT AND TRADEMARK OFFICE
CERTIFICATE OF CORRECTION

PATENT NO.    : 5,600,152
DATED         : February 4, 1997
INVENTOR(S)   : HIRAKU KOZUKA ET AL.

It is certified that error appears in the above-identified patent and that said Letters Patent is hereby corrected as shown below:

COLUMN 9

Line 27, "two dimensional" should read --two-dimensional--.

COLUMN 10

Line 43, "width" should read --width Eg1--.

Signed and Sealed this

Twelfth Day of August, 1997

Attest:

BRUCE LEHMAN

*Attesting Officer*    Commissioner of Patents and Trademarks